United States Patent
Kuznetsov et al.

(10) Patent No.: US 6,719,499 B1
(45) Date of Patent: Apr. 13, 2004

(54) DEVICE FOR POSITIONING A WAFER

(75) Inventors: Vladimir Ivanovich Kuznetsov, Delft (NL); Sijbrand Radelaar, Bilthoven (NL); Jacobus Cornelis Gerardus Van Der Sanden, Geldrop (NL); Theo Anjes Maria Ruijl, Eindhoven (NL)

(73) Assignees: ASM International N.V., Bilthoven (NL); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/889,434

(22) PCT Filed: Jan. 13, 2000

(86) PCT No.: PCT/NL00/00020
§ 371 (c)(1),
(2), (4) Date: Oct. 9, 2001

(87) PCT Pub. No.: WO00/42638
PCT Pub. Date: Jul. 20, 2000

(30) Foreign Application Priority Data

Jan. 13, 1999 (NL) .............................................. 1011017

(51) Int. Cl.⁷ .............................................. B65G 53/38
(52) U.S. Cl. ...................... 406/90; 406/198; 414/939
(58) Field of Search ......................... 414/939; 406/198, 406/90

(56) References Cited

U.S. PATENT DOCUMENTS

| | | | |
|---|---|---|---|
| 4,860,687 A | 8/1989 | Frijlink | ...................... 118/500 |
| 4,874,273 A | 10/1989 | Tokisue et al. | |
| 5,846,332 A | * 12/1998 | Zhao et al. | .................. 118/728 |
| 5,914,278 A | * 6/1999 | Boitnott et al. | .............. 438/724 |
| 6,111,225 A | 8/2000 | Ohkase et al. | .............. 219/390 |
| 6,120,606 A | * 9/2000 | Peng | ........................... 118/719 |
| 6,183,565 B1 | 2/2001 | Granneman et al. | ......... 118/725 |

FOREIGN PATENT DOCUMENTS

| | | |
|---|---|---|
| NL | 8 600 255 | 9/1987 |
| NL | 1 003 538 C | 1/1998 |

* cited by examiner

Primary Examiner—Joseph A. Dillon
(74) Attorney, Agent, or Firm—Knobbe, Martens, Olson & Bear, LLP

(57) ABSTRACT

Device for the floating accommodation of a wafer. This device comprises two mutually opposite parts which delimit a chamber in which the wafer is placed. By gas being supplied from opposite sides, the wafer is held in a floating position. To prevent the wafer from touching the lateral boundaries, it is proposed to provide a discharge of gas at least partially near the circumference of the chamber wherein the wafer is accommodated. This discharge is realised such that if the wafer moves from the intended position to such a gas discharge, by closing of said gas discharge, the pressure is locally increased such that a force is generated acting in opposite direction to return the wafer in the intended position.

19 Claims, 3 Drawing Sheets

DEVICE FOR POSITIONING A WAFER

REFERENCE TO RELATED APPLICATIONS

This application is the national phase of International Application No. PCT/NL00/00020, filed Jan. 13, 2000, which claims the priority date of Jan. 18, 1999.

FIELD OF THE INVENTION

The present invention relates generally to semiconductor processing, and more particularly to an apparatus and method for keeping a floating wafer centered within the apparatus.

Dutch Patent 1003538 describes the individual treatment of wafers. A wafer is accommodated in a reactor, with the distance to the walls of the reactor being set to be comparatively small. It is thus possible for a particularly rapid heat transfer to take place. It is possible to heat the wafer to well above 1000° C. within a few seconds. Since the wafer in principle does not have to be supported during this heating operation, but rather is held accurately in position by the gas streams, local temperature differences caused by mechanical contact are avoided. The very uniform heating of the wafer allows said short heating times to be achieved without the wafer becoming warped. Due to the high capacity of the reactor and the relatively low heat capacity of the wafer, in combination with the efficient heat transfer between the walls of the reactor and the wafer, so that the wafer quickly reaches the temperature of the reactor wall, this rapid heating of the wafer can be achieved with a relatively low peak capacity of the heating means in the reactor. The rapid heating of the wafer enables the total treatment time to be reduced, with the result that such a treatment is able to compete with the batchwise treatment of a series of wafers, while the consequences of problems remain limited to only one wafer.

In the prior art, it is proposed to provide the bottom part of the chamber with pins which can be displaced in the vertical direction in order to move the wafer into the loading and unloading position. During operation, such pins are inactive, since the wafer is then to be in the floating position. By suitably controlling the supply of gas for the various openings which lie on opposite sides of the wafer within the limits of the chamber in which the wafer is accommodated, the latter can be held floating in a very stable manner.

Although in the floating position the wafer is absolutely stable in the axial (vertical) direction, it has been found that the positioning in the radial (horizontal) direction provides problems: the wafer is able to move too easily in the radial direction. This is because of the position of the gas-supply and gas-discharge openings in the reactor, which openings can be regarded as an air bearing or gas bearing. In a radial air bearing which is known in the prior art, the air is supplied at the outside of the disc which is to be supported, and the air is discharged via an opening in the center of the disc which is to be supported; this leads to stable radial positioning. However, this results in considerable pressure differences across the surface of the wafer, while a requirements for a uniform process result is that the range of pressure variation across the wafer is no greater than ±2.5%. In the reactor described in Dutch Patent 1003538, stable positioning is achieved by positioning the gas-discharge openings along the circumferential side of the reactor wall.

Therefore, the object of the present invention is to provide a device which allows extremely accurate radial positioning of the wafer during operation, i.e. during treatment.

SUMMARY OF THE INVENTION

This object is achieved in accordance with one aspect of the invention, with a device for accommodation of a wafer. The device has an accommodation chamber formed by an upper part and a bottom part. The lower part has openings that extend between the accommodation chamber and an underside of the lower part. The openings provide for supply of treatment gas into the accommodation chamber in order to place the wafer in a floating position. Equipment in proximity of an end section of the accommodation chamber is configured to stabilize the wafer in a predetermined floating position. The equipment has a gas discharge and a gas supply that open into the accommodation chamber. The gas discharge and the gas supply are configured so that, upon a displacement of the wafer from the predetermined floating position, a flow resistance between the gas discharge and the gas supply increases at a side of the wafer that faces a direction of displacement such that an increased pressure urges the wafer back in the predetermined floating position.

According to a further possible embodiment, the gas is fed near the circumference edge of the wafer. At approaching the feed opening by the edge of the wafer locally the pressure increases and the wafer is moved back to the intended position. It will be understood that also combinations are possible of feed and discharge openings to obtain the centring effect described above.

According to a preferred embodiment of the invention, an additional opening is provided for introducing of a positioning-gas near the extremity of the wafer i.e. near the discharge for the gases. This gas moves over a part of the surface of the wafer which is not used to any beneficial effect and does not create any significant pressure differences. As a result, this gas can be supplied in relatively large quantities without producing unacceptable pressure differences, i.e. supplying gas for positioning purposes does not effect the treatment of the wafer, but does stabilise its radial position in the chamber in question. According to one proposal, such pressure differences are limited to ±2.5%.

Basically, there are two possible solutions for the positioning of the gas-discharge opening and the positioning-gas supply opening respectively.

According to a first embodiment, the center axis of the gas-discharge line is coaxial with the center axis of the central plane of the treatment chamber. In this case, it is assumed that the wafer is situated in the center of the treatment chamber in the position of use. Movement of the wafer towards the gas-discharge opening results in this opening being closed off to a greater or lesser extent, thus producing a force which pushes it back. In this design, the positioning-gas supply openings are preferably arranged substantially perpendicular to the center plane of the wafer to be treated.

According to an embodiment, these positions of gas-supply and gas-discharge openings are precisely reversed.

Both the gas-discharge opening and the positioning-gas supply opening may be designed in any way which is known in the prior art. The positioning-gas supply opening may comprise a number of openings which are arranged along (part of) a circle. If a complete circle is described, the position of the wafer is controlled in all radial directions. It is also possible for only part of a circle to be described, which is important if the wafer comes out of a supply channel which is connected to the treatment chamber. The positioning-gas supply opening may also be designed as a continuous slot or as a succession of elongate openings. The same applies to the discharge opening, which may be designed as a continuous ring or as a large number of openings or a number of slots. All this depends on the intended design and the desired operating conditions.

Since the positioning-gas is in principle not involved in the treatment of the wafer, it is possible to select a much less expensive gas, such as nitrogen, for this positioning-gas. It is, however, desirable for the gas to be supplied at the same temperature as the actual process gas, in order in this way to eliminate the effects caused by temperature differences as far as possible.

BRIEF DESCRIPTION OF THE DRAWINGS

The invention is explained in more detail with reference to the drawings, which are meant to illustrate and not to limit the invention, and in which.

DETAILED DESCRIPTION OF THE PREFERRED EMBODIMENTS

Figure 1:
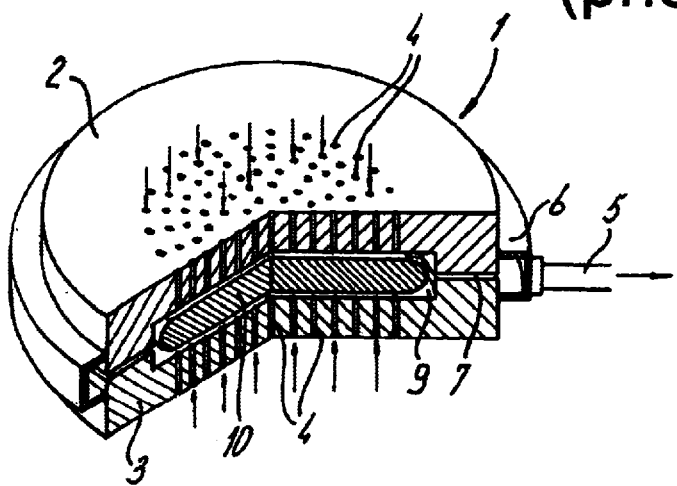
FIG. 1 shows a perspective, partially cut-away, highly diagrammatic view of a structure according to the prior art.

FIG. 1 shows a highly diagrammatic view of a device for the floating accommodation of a substrate or wafer. This device is denoted overall by 1 and comprises a chamber 9 which is delimited by a top part 2 and bottom part 3. Treatment-gas supply openings 4 are present in both the bottom part 3 and the top part 2. Gas is discharged through opening 7, which is annular, and this opening 7 is connected to an annular channel 6 which is connected to a discharge line 5. The wafer to be treated is denoted by 10. FIG. 1 does not show the heating means, which are preferably internal to each of the top part 2 and bottom part 3, nor does it show the structure for metering the gas through the openings 4. Accurate metering through each of the openings is of considerable importance in order to ensure that the wafer floats stably. The gas supplied on the one hand keeps the wafer in a floating position and on the other hand treats the wafer (chemically or physically). For a standard 200 mm wafer, the gas consumption is approximately 2–5 slm. With this design, it is readily possible to position the wafer in the axial direction, but radial stability is not achieved. No feed/discharge for the wafer is shown in the drawing. This feed/discharge may be either horizontal or vertical.

The preferred embodiments provide stabilisation in the radial direction.

Figure 2:
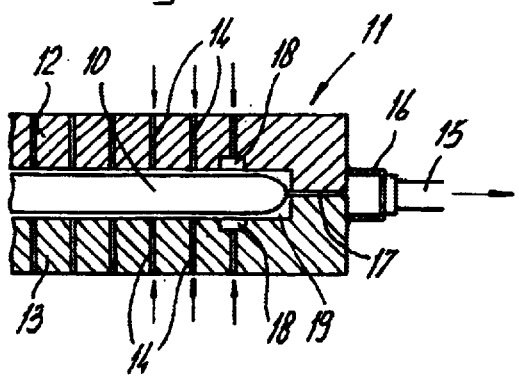
FIG. 2 shows a first variant embodiment according to the invention.

A first device which allows such stabilisation is shown in FIG. 2. In this case, the device is denoted overall by 11, the top part by 12 and the bottom part by 13. The supply openings for the process gas are denoted by 14. The discharge opening is denoted by 17 and is connected to a channel 16 which is connected to a discharge line 15. Discharge opening 17 is designed as an annular gap. The space between top part 12 and bottom part 13 is denoted as chamber 19.

In addition to the above-described gas-supply openings 14 for treatment gas, there are also two positioning-gas supply openings 18 which lie opposite one another. In this design, these openings are designed as a circular groove which extends along the entire circumference of the top part 12 and bottom part 13. It is also possible for this groove to extend only over a limited part of the circumference. Gas from a different source (not shown) from the gas which is introduced into the openings 14 is introduced through this positioning-gas supply opening 18. The volume of gas is considerably greater than the volume of gas which is introduced via the openings 4. An example which may be mentioned is a ratio of approximately 1.5 or greater. This means that there is an increased flow of gas between openings 18 and discharge 17. This covers the end part of the wafer. Since this end part is not relevant for subsequent use, the fact that the process conditions are altered in that area compared to the remaining part of the wafer 10 is not a problem. With regard to the remaining part of the wafer 10, it remains the case that process conditions must be as uniform as possible over the entire surface, and this is achieved by controlling the flow of gas at the various treatment-gas supply openings 14.

This means that a higher flow of gas through the openings 18 is readily permissible, and the result is a strong positioning action at the free end of the wafer.

Figure 3:
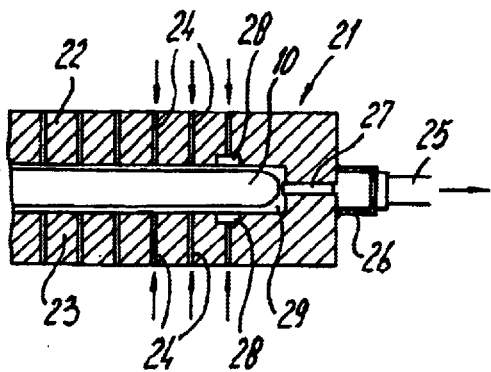
FIG. 3 shows an altered version of FIG. 2.

FIG. 3 shows a variant of the design shown in FIG. 2. The device in accordance with FIG. 3 is denoted overall by 21. This device comprises a top part 22 and bottom part 23. The gas-supply openings for the treatment gas are denoted by 24. The space between top part 22 and bottom part 23 is denoted as chamber 29. The discharge opening is denoted by 27 and opens out into a channel 26 which is connected to a line 25. In the example shown in FIG. 3, the discharge opening 27 comprises a number of slots which are distributed along the circumference. This enables further optimisation of the pressure profile between the positioning-gas supply opening 28 and these openings 27 to be provided. In an example for a 200 mm wafer, the distance between the wafer and the top part 22 and bottom part 23 was approximately 0.1–0.15 mm. The distance between the opening 28 and the slots 27 was approximately 4 mm, while the length of the slots 27 was approximately 5 mm, with a height of 0.25–0.50 mm, thirty such slots 27 being present.

It should be understood that the described shape of the positioning-gas supply opening and of the gas-discharge opening relates to the boundary face with the chamber.

Figure 4:
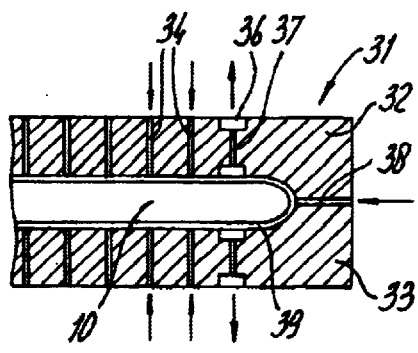
FIG. 4 shows a further variant embodiment according to the invention.

FIG. 4 shows a further variant of the invention, which is denoted overall by 31. The top part is denoted by 32 and the bottom part by 33, while the supply openings for treatment gas are denoted by 34. As in the preceding Figures, the wafer is denoted by 10 and the chamber in which the wafer is situated is denoted by 39. 37 denotes the gas-discharge opening which is now no longer situated in line with the center plane of the wafer, but rather perpendicular thereto. A channel 36 adjoins this discharge opening in a conventional manner. The positioning-gas is supplied through an opening 38. This opening may comprise a number of holes 38, as shown in FIG. 4. Variants which lie between these options are also possible.

Moreover, the end of chamber 39 is adapted to the shape of the end of the wafer (rounded off in an essentially identical way). Such adaptation may also be incorporated in the designs shown in FIGS. 1–3.

Figure 5:
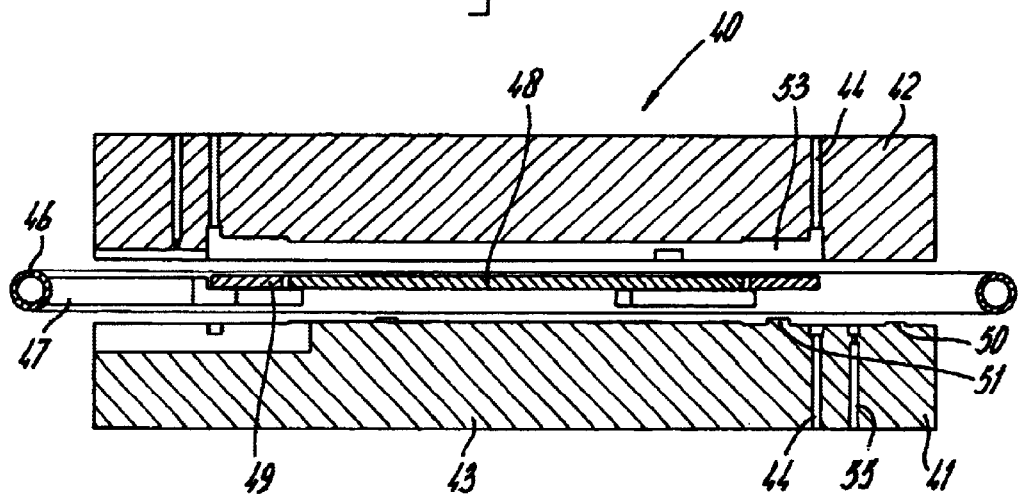
FIG. 5 an embodiment with anti slip ring in cross-section and opened position.
Figure 6:
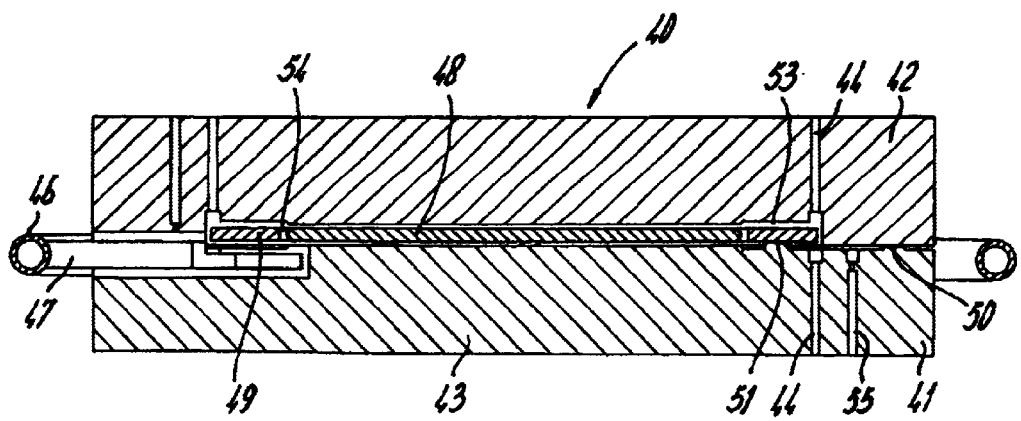
FIG. 6 the structure according to FIG. 5 in closed position of use.
Figure 7:
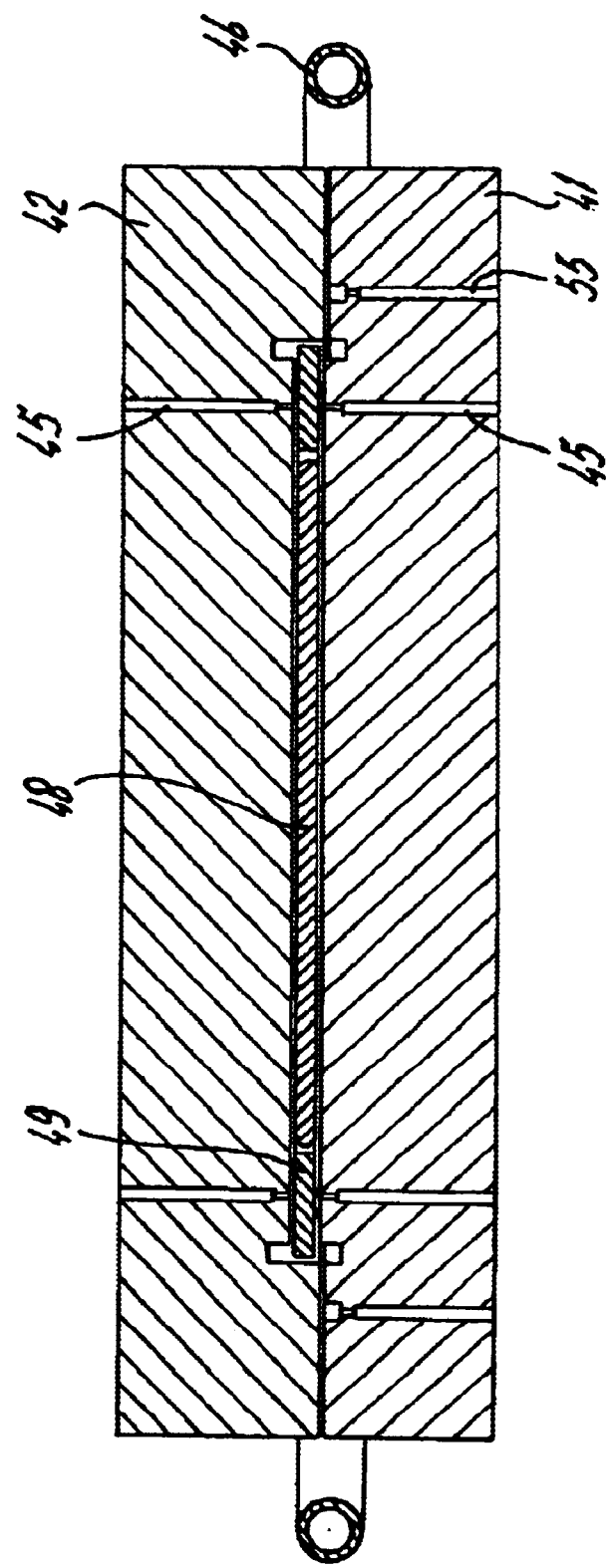
FIG. 7 the structure according to FIG. 6 in a different cross-section.

In FIGS. 5, 6 and 7 a further alternative of the invention is shown. The wafer is transported therein with a so-called anti-slip ring. This ring is referred to by 49 and is supported by a number of support fingers 47 of a support ring 46. The function of this ring is to realize heating and cooling of the wafer as uniformly as possible. Through the heat capacity of ring 49 it is prevented that the wafer 48 is heated or cooled faster near its periphery that in its center having adverse consequences. The device shown in FIGS. 5 and 6 is generally referred to by 40. As in the previous embodiments it comprises an upper portion 42 and a lower portion 43. In the closed position as shown in FIG. 6 a compartment is delimited there between. The closed position of the upper portion 42 and lower portion 43 is determined by abutment cams 50. Ring 49 extends over the full circumference of wafer 48 and rests in closed position of the reactor on the cams or circumferential edge 51. 55 shows a duct for introducing of nitrogen. The gas emanating from this channel, functions as shield so that the treatment gas is confined in the reactor. 44 shows a discharge duct. It opens in a groove 53 wherein ring 49 is received. In FIG. 7 the feed of wafer positioning-gas is shown by 45. Groove 53 is near cams 51 and support fingers 47 higher than on other locations along the circumference of the wafers, where to discharge the gas in outward directly only a narrow gap between the wafer and upper portion, lower portion respectively is provided as shown in the cross-section shown in FIG. 7. The opening 54 is not shown on full scale and is somewhat enlarged relative to this gap. Because of that in this embodiment in the closed position as shown in FIGS. 6 and 7 this opening 54 will determine the feed of gas through the higher portions of the groove near the cams and support fingers to the enlarged outer portion of the groove 53 and the adjoining ducts 44. I.e., if for example wafer 48 moves to the left, the opening 54 shown in FIG. 6 is closed and locally a pressure is built up so that the wafer is biased to the right.

Through the heat capacity of ring 49 it is prevented that the wafer 48 is heated or cooled faster near its periphery than in its centre having adverse consequences. The device shown in FIGS. 5 and 6 is generally referred to by 40. As in the previous embodiments it comprises an upper portion 42 and a lower portion 43. In the closed position as shown in FIG. 6 a compartment is delimited there between. The closed position of the upper portion 42 and lower portion 43 is determined by abutment cams 50. Ring 49 extends over the full circumference of wafer 48 and rests in closed position of the reactor on the cams or circumferential edge 51. 55 shows a duct for introducing of nitrogen. The gas emanating from this channel, functions as shield so that the treatment gas is confined in the reactor. 44 shows a discharge duct. It opens in a groove 53 wherein ring 49 is received. In FIG. 7 the feed of wafer positioning-gas is shown by 45. Groove 53 is near cams 51 and support fingers 47 higher than on other locations along the circumference of the wafers, where to discharge the gas in outward directly only a narrow gap between the wafer and upper portion, lower portion respectively is provided as shown in the cross-section shown in FIG. 7. The opening 54 is not shown on full scale and is somewhat enlarged relative to this gap. Because of that in this embodiment in the closed position as shown in FIGS. 6 and 7 this opening 54 will determine the feed of gas through the higher portions of the groove near the cams and support fingers to the enlarged outer portion of the groove 53 and the adjoining ducts 44. I.e. if for example wafer 48 moves to the left, the opening 54 shown in FIG. 6 is closed and locally a pressure is built up so that the wafer is biassed to the right.

Except to provide a closure for the sealing gas by admitting nitrogen to channel 43, through the supply of additional nitrogen a further centring effect of the wafer is realised.

It will be understood from the above that there are numerous variants allowing a wafer to be positioned in a chamber. It must be stressed that this positioning is not required along the entire circumference of the wafer. This will depend on the conditions. The variants referred to above lie within the scope of the appended claims.

What is claimed is:

1. A device for semiconductor processing comprising:
   an accommodation chamber formed by an upper part and a bottom part, the lower part having openings extending between the accommodation chamber and an underside of the lower part, the openings providing for supply of process gas into the accommodation chamber in order to place a wafer in a floating position; and
   equipment in proximity of an end section of the accommodation chamber and configured to stabilize the wafer in a predetermined floating position, wherein the equipment comprises a gas discharge and a gas supply that open into the accommodation chamber, wherein the gas discharge and the gas supply are configured so that upon a displacement of the wafer from the predetermined floating position a flow resistance between the gas discharge and the gas supply increases at a side of the wafer in direction of the displacement such that an increased pressure urges the wafer back in the predetermined floating position.

2. The device of claim 1, wherein the gas discharge comprises at least three openings provided along a circumference of the accommodation chamber, and wherein the at least three openings of the gas discharge face a side of the wafer.

3. The device of claim 1, wherein the gas supply outputs positioning gas, and
   wherein a center axis of the gas discharge and a center axis of the gas supply are placed such that the positioning gas emerging from the gas supply has at least a component perpendicular to the center axis of the gas supply.

4. The device of claim 3, wherein the gas supply has supply openings for the positioning gas, the supply openings being provided in proximity of a circumference of the accommodation chamber.

5. The device of claim 1, wherein the equipment further comprises a gas supply for process gas having supply openings for process gas, the supply openings arranged to provide the process gas over a surface of the wafer.

6. The device of claim 3, wherein a supply opening for the positioning gas has a cross section area that is at least 1.5 times larger than a cross section area of a supply opening for the process gas.

7. The device of claim 3, wherein the center axis of the gas discharge opening is essentially perpendicular to a center plane of the predetermined floating position of the wafer, and wherein the openings of the gas supply for positioning gas are arranged so that a stream of positioning gas which emerges therefrom has at least one component which lies in the center plane of the predetermined floating position of the wafer.

8. The device of claim 7, wherein the opening of the gas supply for positioning gas is elongate.

9. The device of claim 3, wherein the opening of the gas supply for process gas and the opening of the gas supply for positioning gas are connected to different gas sources.

10. The device of claim 3, wherein the opening of the gas discharge has a shape that substantially corresponds to a shape of the edge of the wafer.

11. The device of claim 1, wherein the accommodation chamber has openings for a gas supply for positioning gas that are located on opposite sides of the accommodation chamber.

12. The device of claim 1, further comprising a separate discharge opening for process gas.

13. The device of claim 12, wherein the discharge opening is substantially provided in a center of the accommodation chamber.

14. The device of claim 12, wherein in the opening of said gas-discharge opening a ring is provided.

15. The device of claim 4, wherein the positioning opening of the gas supply gas is elongate.

16. The device of claim 4, wherein the treatment openings of the gas supply for treatment gas and the positioning openings are connected to different gas sources.

17. The device of claim 2, further comprising a ring in the opening of said gas discharge opening.

18. The device of claim 17, further comprising a duct for introducing a shield gas opening in a groove in which said ring is received.

19. A device for semiconductor processing comprising:
   an upper part having an inner surface and an outer surface;
   a bottom part having an inner surface and an outer surface and configured to cooperate with the upper part to form a process chamber for a wafer, the bottom part having openings extending between the inner surface and the outer surface, the openings supplying process gas into the process chamber in order to place a wafer in a floating position;
   a gas supply opening into the process chamber; and
   a gas discharge opening into the process chamber, wherein the gas supply and the gas discharge are located in proximity of a radial end section of the process chamber and configured to stabilize the wafer in a predetermined floating position, wherein the gas discharge and the gas supply are configured so that upon a displacement of the wafer from the predetermined floating position a flow resistance between the gas discharge and the gas supply increases at a side of the wafer that faces a direction of displacement such that an increased pressure urges the wafer back in the predetermined floating position.

* * * * *